Figure 1:
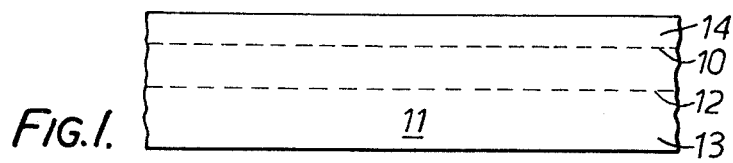

United States Patent [19]
Wisbey

[11] 3,930,912
[45] Jan. 6, 1976

[54] METHOD OF MANUFACTURING LIGHT EMITTING DIODES

[75] Inventor: Philip Henry Wisbey, Braintree, England

[73] Assignee: The Marconi Company Limited, Chelmsford, England

[22] Filed: Sept. 16, 1974

[21] Appl. No.: 506,006

[30] Foreign Application Priority Data
Nov. 2, 1973 United Kingdom............... 50970/73

[52] U.S. Cl. ........................ 156/3; 29/580; 29/591; 148/175; 148/187; 156/13; 156/17; 427/85; 427/89
[51] Int. Cl.².................................... H01L 21/20
[58] Field of Search ............... 156/11, 13, 17, 18, 3; 29/378, 580, 591, 628; 357/15, 17, 56; 427/85, 88, 92; 148/175, 186, 187

[56] References Cited
UNITED STATES PATENTS

| | | | |
|---|---|---|---|
| 3,559,283 | 2/1971 | Kravitz................................... | 156/17 |
| 3,590,479 | 7/1971 | Deuries................................. | 29/580 |
| 3,689,993 | 9/1972 | Tolar..................................... | 357/15 |
| 3,746,587 | 7/1973 | Rosvold................................. | 156/17 |
| 3,765,970 | 10/1973 | Athanas et al........................ | 29/580 |
| 3,767,494 | 10/1973 | Muraoka et al. ..................... | 156/17 |
| 3,805,376 | 4/1974 | D'Asaro et al........................ | 357/17 |
| 3,853,650 | 12/1974 | Hartlaub.............................. | 156/13 |

Primary Examiner—Douglas J. Drummond
Assistant Examiner—Jerome W. Massie
Attorney, Agent, or Firm—Baldwin, Wight & Brown

[57] ABSTRACT

The invention relates to the manufacture of arrays of light emitting diodes (L.E.D.'s) from a wafer consisting of an n-type epitaxial layer on an n⁺ substrate. The method includes the steps of forming p-type islands by diffusing a p-type dopant into the epitaxial layer of an n on n⁺ wafer, establishing contact with all of the p-type islands by means of a first set of conductors, mounting the wafer on a transparent support with the first set of conductors adjacent the support, depositing a second set of conductors on the n⁺ substrate and etching both the substrate and the epitaxial layer from between the conductors of the second set, the two sets of conductors being orthogonal and each p-n junction formed by a p-type island and the epitaxial layer being in contact with one and only one conductor from each set.

6 Claims, 5 Drawing Figures

U.S. Patent  Jan. 6, 1976  3,930,912

METHOD OF MANUFACTURING LIGHT EMITTING DIODES

This invention relates to integrated arrays of light emitting diodes (LED's) in which the LED's are individually addressable.

The material commonly available for fabrication of LED arrays is a wafer consisting of an epitaxial layer of n-type material on an $n^+$ substrate. To form the LED's, p-type islands are diffused into the epitaxial layer using a silicon dioxide diffusion mask. If the p-n junctions are used as light emitting diodes then they are not mutually isolated in that the n-type epitaxial layer is common to all the diodes. There therefore arises a problem of lead access if high resolution is required.

One alternative to this would be to diffuse n-type dopant into the p-type islands following the normal silicon planar integrated circuit approach to the fabrication of an X-Y addressed array of diodes. This technique, however, does not yield efficient LED's.

A further alternative is to divide the wafer into discrete dice and to provide orthogonal connections to the discrete dice. In this case, as the dice are mounted individually it is difficult to provide high density of dice so that apart from increasing the complexity of manufacture the resolution of the array is adversely affected.

The present invention seeks to provide a method of manufacturing an integrated array of LED's from an n on $n^+$ epitaxial material which does not suffer from the foregoing disadvantages.

According to the present invention there is provided a method of forming an array of LED's including the steps of forming p-type islands by diffusing a p-type dopant into the epitaxial layer of an n on $n^+$ wafer, establishing contact with all of the p-type islands by means of a first set of conductors, mounting the wafer on a transparent support with the first set of conductors adjacent the support, depositing a second set of conductors on the $n^+$ substrate and etching both the substrate and the epitaxial layer from between the conductors of the second set, the two sets of conductors being orthogonal and each p-n junction formed by a p-type island and the epitaxial layer being in contact with one and only one conductor from each set.

Preferably the first set of conductors is arranged to cover the p-type islands and is provided with windows from which a portion of the islands may be viewed.

The first set of conductors are advantageously plated up to provide a substantial metal conductor, preferably of copper.

The support is made of a thermally conductive and transparent material, a good example of which is sapphire.

To enable a connection to be made to the copper conductors it is possible to etch away totally the wafer material at one edge to expose the conductors and then to mount the wafer on the support by means of an epoxy resin. It is preferable, however, to form on the surface of the support a pattern of conductors which registers with the copper conductors on the wafer but which extends beyond the wafer. The wafer may then be secured to the support by alloying the co-registering patterns.

Advantageously, the thickness of the substrate is reduced, for example by lapping, prior to the deposition of the second set of conductors so as to reduce the extent of the undercut when the wafer material between the conductors of the second set is etched away.

The invention will now be described further, by way of example, with reference to the accompanying drawings which show sections through an epitaxial wafer at different stages in the manufacture of an LED integrated array.

FIG. 1 shows the basic epitaxial wafer 11 from which the LED array is made. The epitaxial wafer 11 consisting of an $n^+$ GaAs substrate 13 with an n GaAsP epitaxial layer 14. The junction between the n epitaxial layer 14 and the $n^+$ substrate 13 is not abrupt but graded and as such cannot be represented by a solid line. It is for this reason that two dotted lines 10 and 12 are used to denote the region over which the transition from $n^+$ to n takes place.

Figure 2:
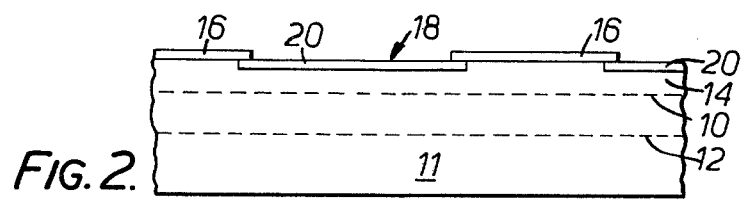

On the epitaxial layer 14 there is deposited a $SiO_2$ film 16 in which windows 18 are opened (see FIG. 2). A diffusion is then carried out to produce $p^+$ islands 20 in the n epitaxial layer 14. The $p^+$ islands 20 are arranged in rows and columns in an orthogonal matrix.

Figure 3:
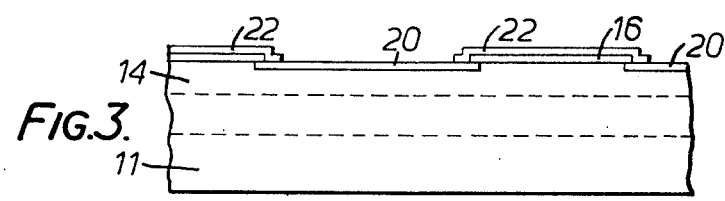

In the next stage, shown in FIG. 3, a metal coating 22 is deposited over the remaining portions of the $SiO_2$ film 16 to provide an electrical contact to the $p^+$ islands 20. The coating, which is formed by a photolithographic technique, has the form of parallel wide stripes overlying all the islands, with windows in the stripes exposing parts of the $p^+$ islands. The metal in each stripe of the coating 22 totally surrounds the edges of the $p^+$ islands in one row but is electrically isolated from all the other $p^+$ islands.

Figure 4:
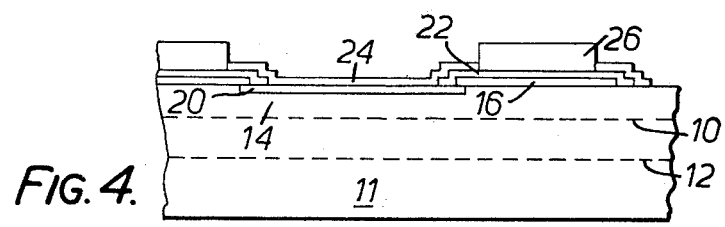

A further $SiO_2$ layer 24 is now applied to the wafer to cover the $p^+$ islands, (see FIG. 4). This layer serves as a mask during a plating process in which a substantial plating 26 of good conductor such as copper is deposited onto the exposed parts of the metal coating 22. The plating 26 of copper (see FIG. 4) not only serves as the anode electrodes for the diodes formed between the $p^+$ islands 20 and the n epitaxial layer 14 but also provides a path for heat dissipation when the wafer is mounted.

Figure 5:
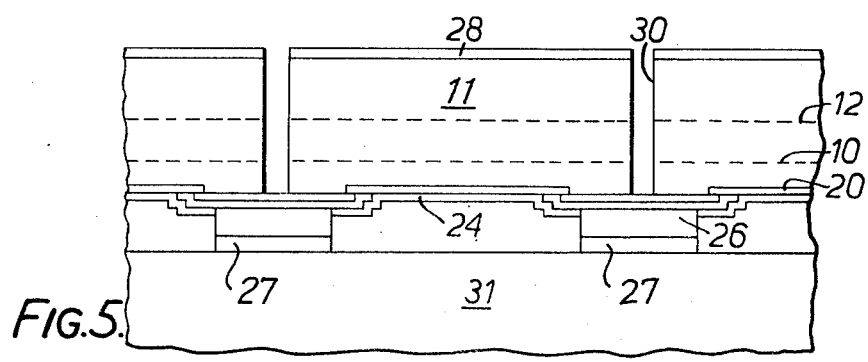

The wafer is now mounted on a sapphire support 31 (see FIG. 5) which is earlier plated with a pattern 27 co-registering with the copper electrodes 26 of the wafer and the two copper platings are then suitably bonded to one another. The use of sapphire enables the diodes to be seen at the same time as offering a sink for the generated heat.

After the wafer has been mounted onto the sapphire it is suitably reduced in thickness by lapping and a metal mask 28 is formed on the exposed surface of the substrate. Through the mask 28 all the material of the wafer is etched away along channels 30 perpendicular to the row conductors. As the mask 28 is of a metal it may itself serve as the column electrodes.

I claim:

1. A method of forming a plurality of light emitting diodes in an arrangement of columns and rows, said method comprising the steps of:
    providing an n-type epitaxial layer formed on an $n^+$-type substrate;
    diffusing a p-type dopant into selected regions of said epitaxial n-type layer to form a plurality of p-type islands arranged in columns and rows, each p-type island having a junction with said n-type epitaxial layer to form a p-n diode of said arrangement;
    covering each row of said arrangement with a different one of a plurality of first conductors, each first conductor being electrically connected to all p-n diodes in its row and being electrically isolated from every other first conductor;

mounting said arrangement on a transparent support with said plurality of first conductors adjacent thereto;

covering said n$^+$ type substrate with a plurality of second conductors in orthogonal relation to said plurality of first conductors, each second conductor being aligned with a different one of said columns and said second conductors being spaced apart to form gaps therebetween which are registered with areas between p-type islands; and etching those portions of said n-type epitaxial layer and said n$^+$ type substrate which coincide with said gaps.

2. A method as recited in claim 1 in which said first conductors are arranged to cover the p-type islands and are provided with windows from which a portion of the islands may be viewed.

3. A method as recited in claim 1 in which said first set of conductors are plated up to provide a substantial metal conductor.

4. A method as recited in claim 3 wherein said metal conductor is formed of copper.

5. A method as recited in claim 1 wherein said transparent support is made of sapphire.

6. A method as recited in claim 1 wherein the thickness of said substrate is reduced prior to depositing said second set of conductors thereon.

\* \* \* \* \*